United States Patent
Halling

(10) Patent No.: US 6,657,209 B2
(45) Date of Patent: Dec. 2, 2003

(54) METHOD AND SYSTEM FOR DETERMINING PRESSURE COMPENSATION FACTORS IN AN ION IMPLANTER

(75) Inventor: Alfred Michael Halling, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 437 days.

(21) Appl. No.: 09/772,146

(22) Filed: Jan. 29, 2001

(65) Prior Publication Data

US 2002/0130277 A1 Sep. 19, 2002

Related U.S. Application Data

(60) Provisional application No. 60/234,088, filed on Sep. 20, 2000.

(51) Int. Cl.[7] .............................................. H01J 37/317
(52) U.S. Cl. ................................... 250/492.21; 250/397
(58) Field of Search .......................... 250/492.21, 397, 250/398

(56) References Cited

U.S. PATENT DOCUMENTS

| | | | | |
|---|---|---|---|---|
| 4,539,217 A | | 9/1985 | Farley | 427/10 |
| 4,587,433 A | * | 5/1986 | Farley | 250/492.2 |
| 5,760,409 A | * | 6/1998 | Chen et al. | 250/492.21 |
| 5,998,798 A | | 12/1999 | Halling et al. | 250/492.21 |
| 6,031,240 A | * | 2/2000 | Kodama | 250/492.21 |
| 6,093,625 A | | 7/2000 | Wagner et al. | 250/492.21 |
| 6,297,510 B1 | * | 10/2001 | Farley | 250/492.21 |

OTHER PUBLICATIONS

"Charge Neutralization", reprinted from the Internet at: http://www.casetechnology.com/implanter/neutral.html, 4 pp.

"The Faraday", reprinted from the Internet at: http://www-.casetechnology.com/implanter/faraday.html, 2 pp.

* cited by examiner

Primary Examiner—Bruce Anderson
(74) Attorney, Agent, or Firm—Eschweiler & Associates, LLC

(57) ABSTRACT

The invention provides a method and system for determining a pressure compensation factor for use in an ion implanter, which uses one or a small number of test workpieces. The method includes providing a test workpiece in the ion implantation system, wherein the test workpiece has at least one band region, assuming a predicted pressure compensation factor, implanting the at least one band region of the test workpiece with an ion beam using the ion implantation system and the predicted pressure compensation factor while measuring ion beam current and a pressure in the ion implantation system, measuring a sheet resistance associated with the implanted test workpiece, and determining a pressure compensation factor according to the predicted pressure compensation factor, the measured sheet resistance, the measured ion beam current, and the measured pressure.

28 Claims, 12 Drawing Sheets

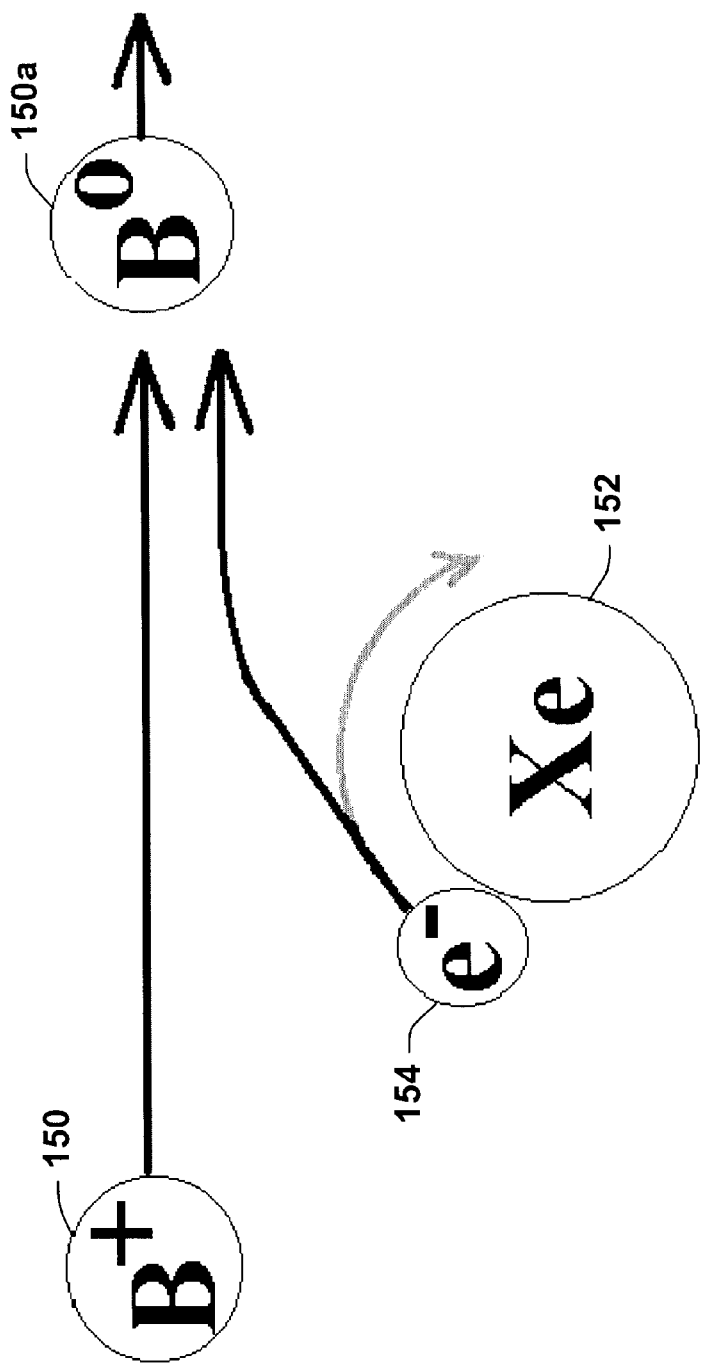

Data overlaid by an exponential fit. The equation of the fit is $y = 6.7e^{-2827x}$
Hence $K = 2827$ and $PCOMP = 32.7\%$.

| | | Implant results from first initial estimate of K-factor. In general, K-factor was off by more than 50% from correct value. 210a | | | | Implant Results after first calibration run 210b | | | |
|---|---|---|---|---|---|---|---|---|---|
| Species | Energy | Pcomp used for implant | Rs of bare implant | Rs of PR implant | Dose shift bare to PR | Pcomp used for implant | Rs of bare implant | Rs of PR implant | Dose shift bare to PR |
| B | 5 | 20.0 | 146.53 | 146.99 | .03% | 18.0 | 146.60 | 146.41 | -0.1% |
| B | 10 | 36.0 | 134.67 | 140.84 | 4.4% | 20.0 | 129.29 | 129.29 | 0.0% |
| B | 30 | 46.0 | 109.08 | 114.56 | 4.8% | 32.0 | 108.05 | 109.82 | 1.6% |
| B | 50 | 55.0 | 103.01 | 111.57 | 7.7% | 33.0 | 101.04 | 100.02 | -1.0% |
| B | 70 | 55.0 | 101.49 | 112.73 | 10.0% | 32.0 | 97.29 | 99.48 | 2.2% |
| BF2 | 50 | 20.0 | 138.45 | 138.60 | 0.1% | 20.0 | 141.36 | 140.08 | -0.9% |
| BF2 | 70 | 20.0 | 126.60 | 129.34 | 2.1% | 15.0 | 127.89 | 127.75 | -0.1% |
| P | 50 | 15.0 | 78.81 | 80.07 | 1.6% | 11.0 | 74.94 | 75.36 | 0.6% |
| P | 70 | 16.7 | 77.82 | 80.33 | 3.1% | 11.0 | 73.75 | 74.75 | 1.6% |
| As | 50 | 2.0 | 109.38 | 108.94 | -0.4% | 2.5 | 106.18 | 107.24 | 1.0% |
| As | 70 | 2.0 | 102.45 | 102.23 | -0.2% | 2.5 | 103.47 | 102.07 | -1.4% |

FIG. 8

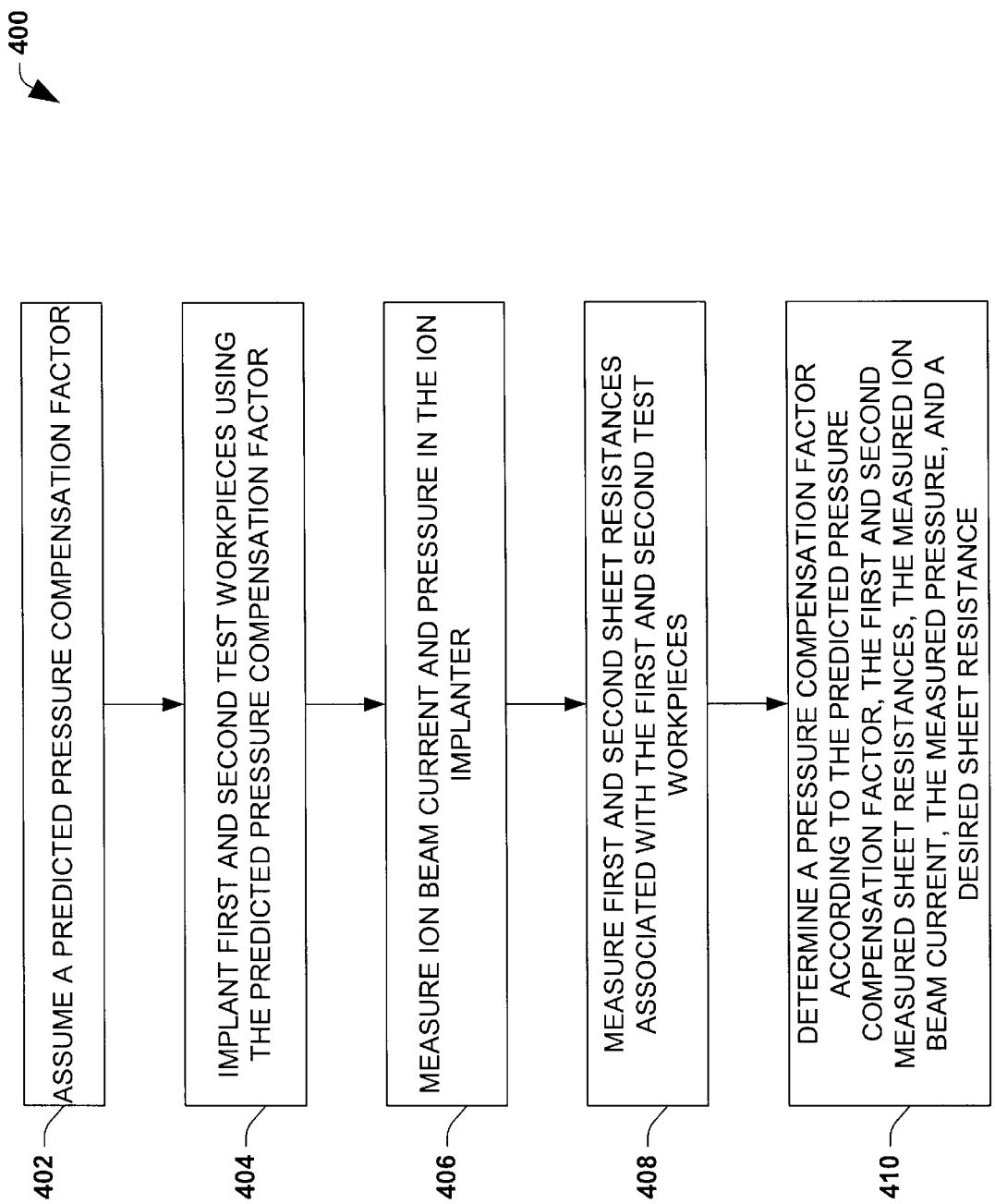

METHOD AND SYSTEM FOR DETERMINING PRESSURE COMPENSATION FACTORS IN AN ION IMPLANTER

This application claims the benefit of provisional application 60/234,088 filed Sep. 20, 2000.

FIELD OF THE INVENTION

The present invention relates generally to batch ion implantation systems, and more particularly to a method and system for determining pressure compensation factors in an ion implanter.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is typically evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

Dosimetry is the measurement of ions implanted in a wafer or other workpiece. In controlling the dosage of implanted ions, closed loop feedback control systems typically are utilized in order to dynamically adjust the implantation to achieve uniformity in the implanted workpiece. Such control systems utilize real-time current monitoring to control the slow scan velocity. A Faraday disk or Faraday cup periodically measures the beam current and adjusts the slow scan speed to ensure constant dosing. Frequent measurement allows the dose control system to respond quickly to changes in beam current. The Faraday cup may be stationary, well shielded, and located close to the wafers, making it sensitive to the beam current actually dosing the wafers.

Faraday cups measure only the electric current. Interactions between the ion beam and gases evolved during implant can cause the electric current, a charge flux, to vary even when the particle current, a dopant flux, is constant. To compensate for this effect, the dose controller reads the beam current from the Faraday cup and the pressure from a pressure gauge simultaneously. When a pressure compensation factor (PCOMP) is specified for an implantation recipe, the measured beam current is modified by software to present a compensated beam current signal to the circuit controlling the slow scan. The amount of compensation (e.g., in the compensated beam current signal) in such a closed loop system may thus be a function of both the pressure and the pressure compensation factor.

When properly applied, pressure compensation improves repeatability and uniformity over a wide range of implant pressures. However, the vacuum in an implanter is never perfect. There is always some residual gas in the system. Usually the residual gas poses no problems (in fact, a small amount of residual gas is needed for good beam transport and effective charge control). However, at high enough pressure, charge exchange between the ion beam and the residual gas can cause dosimetry errors. If the shift in dose between implants into bare wafers and implants into photoresist-coated (PR) wafers is unacceptably large, or if the dose uniformity is significantly degraded, then pressure compensation may be employed in order to ensure uniformity.

Charge exchange reactions between ion beams and residual gas can add or subtract electrons from the ion, changing the ion's charge state from the value stated in the recipe. When the charge exchange reaction is neutralization, a portion of the incident ion flux is neutralized. The result is a reduction in the electrical current while the particle current (including neutrals) remains unchanged. When the charge exchange reaction is electron stripping, a portion of the ion flux loses electrons. The result is an increase in the electrical current while the particle current remains the same.

For typical recipes where charge exchange is an issue, the beam undergoes much more neutralization than stripping. As a result, the beam current measured by the Faraday cup decreases whenever the end station pressure increases. Ions in the beam are neutralized, but they are not deflected or stopped by residual gas. The dose rate, dopant atoms per area per time, is unchanged by charge exchange after the analyzer magnet. Implanted neutrals contribute to the dose received by the wafer, but are not measured by the Faraday cup. As a result, the wafer is overdosed. Without pressure compensation, charge exchange neutralization can limit the dose uniformity and repeatability.

Pressure Compensation may thus be employed whenever charge exchange between the ion beam and residual gas in the process chamber has a significant effect on dose. The pressure at which this happens depends on the recipe and the process specification. For some recipes, compensation is required to meet implanter specification when the pressure due to photoresist outgassing is $5 \times 10^{-6}$ torr as measured on the pressure gauge. For recipes where the pressure due to photoresist outgassing is $2 \times 10^{-5}$ torr or higher, compensation is worth investigating. Such compensation may include measuring the effect of photoresist outgassing by implanting monitor wafers with and without photoresist, and comparing the measured variation to the process specification. The amount of compensation required depends on the pressure, which the dose controller reads from the pressure gauge during the implant. It also depends on a recipe-selectable parameter PCOMP that accounts for other factors.

Some of these factors depend on the hardware configuration (size and number of pumps, location of pumps, location of ion gauge); other factors depend on the recipe: ion species, charge state, and energy. The dependence of PCOMP on energy is weak in the range from 20 keV to 90 keV. In general, however, PCOMP should be determined for each recipe and implanter. The parameters necessary for pressure compensation have traditionally been determined by implanting a matrix of at least four test wafers at non-standard operating conditions. However, test wafers are expensive. In addition, the implantation and measurement of such test wafers requires an implantation system to be taken off line, resulting in lost production and other costs. Thus, there is a need for improved methods and systems for determining pressure compensation factors in ion implanters.

SUMMARY OF THE INVENTION

The present invention is directed to a method and system for determining a pressure compensation factor for use in an ion implantation system. In accordance with one aspect of the present invention, the method comprises providing a test workpiece in the ion implantation system, the test workpiece having at least one band region, assuming an initial predicted pressure compensation factor. The method further comprises implanting the at least one band region of the test workpiece with an ion beam using the ion implantation system and the initial predicted pressure compensation factor while measuring ion beam current and a pressure in the ion implantation system. A sheet resistance associated with the implanted test workpiece is then measured, and a pressure compensation factor is determined according to the initial predicted pressure compensation factor, the measured sheet resistance, the measured ion beam current, the measured pressure, and a desired sheet resistance. The method thus provides a compensation factor while using only one test workpiece or wafer, via the employment of measured pressure information.

In order to further refine the compensation factor determination, first and second test workpieces may be provided in the ion implantation system, wherein the first and second test workpieces each have at least one band region, and wherein one of the first and second test workpieces includes a photoresist, and the other of the first and second test workpieces is bare or a blank wafer. The method further comprises assuming an initial predicted pressure compensation factor, implanting the at least one band region of the first and second test workpieces with an ion beam using the ion implantation system and the initial predicted pressure compensation factor while measuring ion beam current and a pressure in the ion implantation system. First and second sheet resistances associated with the implanted first and second test workpieces are then measured, respectively, and a pressure compensation factor is determined according to the initial predicted pressure compensation factor, the first and second measured sheet resistances, the measured ion beam current, the measured pressure and a desired sheet resistance.

In accordance with another aspect of the invention, there is provided a system for determining a pressure compensation factor for use in an ion implantation system, which comprises a test workpiece having at least one band region, and a means for implanting the at least one band region of the test workpiece with an ion beam using the ion implantation system and an initial predicted pressure compensation factor. The system further comprises means for measuring an ion beam current and a pressure in the ion implantation system, and a means for measuring a sheet resistance associated with the implanted test workpiece. Lastly, the system further comprises a means for determining a pressure compensation factor according to the initial predicted pressure compensation factor, the measured sheet resistance, the measured ion beam current, the measured pressure, and a desired sheet resistance.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 2 is a graphical illustration of a boron ion suffering charge exchange with neutral xenon gas;

FIG. 8 is a table illustrating test results from a two implant calibration matching sheet resistance from a bare monitor implant and a photoresist coated monitor implant;

FIG. 10 is a flow diagram illustrating another exemplary method in accordance with the invention.

DETAILED DESCRIPTION OF THE INVENTION

Figure 1A:
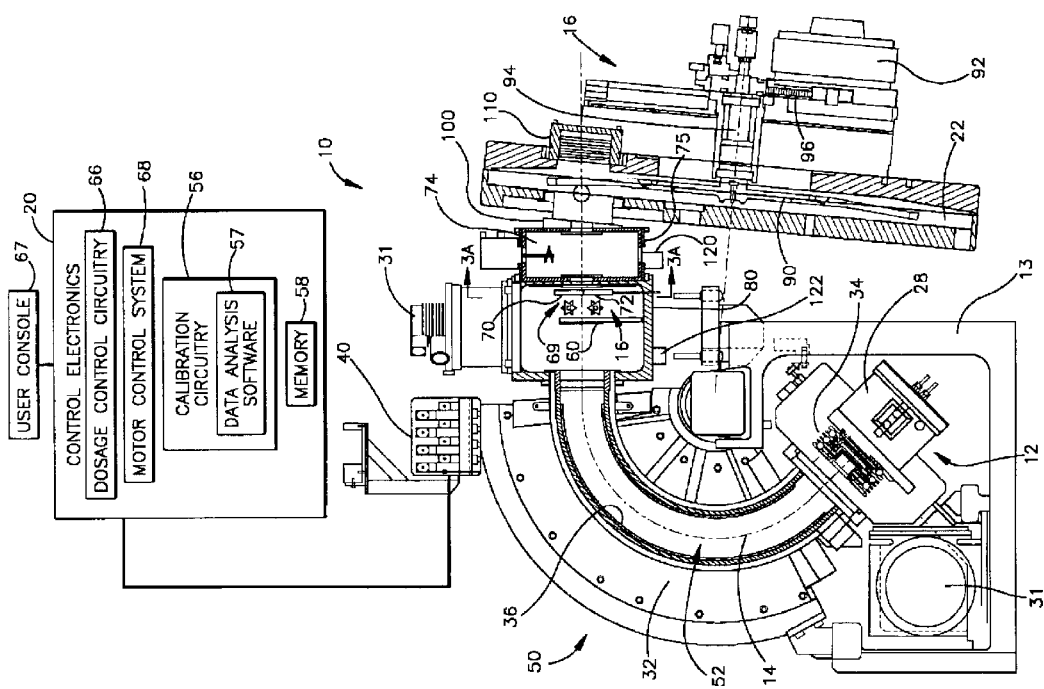
FIG. 1A is a schematic top plan view of an ion beam implanter of the present invention.

The present invention will now be described with reference to the drawings wherein like reference numerals are used to refer to like elements throughout. The invention provides a method and system for determining a pressure compensation factor for use in an ion implanter.

Figure 1B:
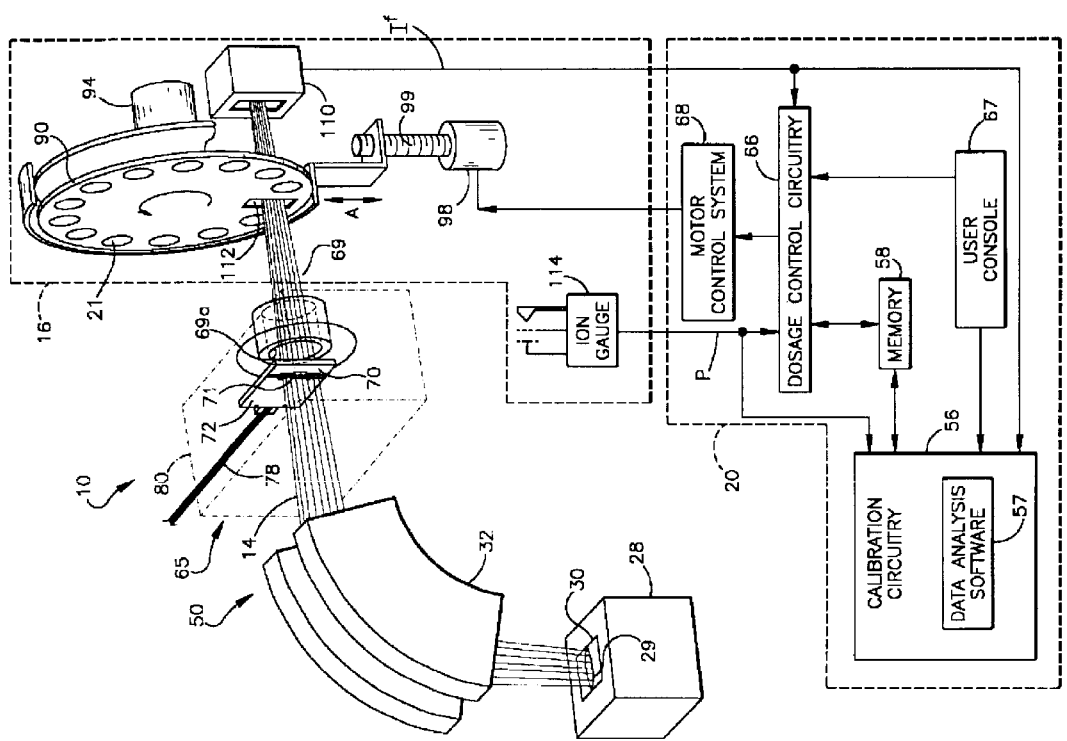
FIG. 1B is a schematic perspective view of selected components of the ion beam implanter of FIG. 1A.

Referring now to the drawings, FIGS. 1A and 1B illustrate an ion beam implanter shown generally at 10, in which the various aspects of the present invention may be implemented. The implanter 10 includes an ion source 12 mounted to an "L" shaped support 13 for providing ions that form an ion beam 14 which traverses a beam path to an implantation or end station 16. Control electronics (shown schematically at 20) are provided for monitoring and controlling the ion dosage received by a plurality of semiconductor wafer workpieces 21 (FIG. 1B) within an implantation region or chamber 22 of the implantation station 16. Operator input to the control electronics 20 is performed via a user console 67.

The ion source housing 12 generates the ion beam 14 which impacts the wafer workpieces 21 disposed on a rotating and translating disk-shaped support 90 in the implantation chamber 22. Although a rotating, translating support 24 is disclosed, it should also be appreciated that the present invention is equally applicable to a "serial" ion beam implanter, that is, one in which the ion beam is directed to scan over the surface of a stationary workpiece. The ions in the ion beam 14 tend to diverge as the beam traverses a distance between the ion source 12 and the implantation station 16. The ion source 12 includes a plasma chamber 28 defining an interior region into which source materials are injected. The source materials may include an ionizable gas or vaporized source material. Source material in solid form is deposited into a vaporizer which is then injected into the plasma chamber 28. If an n type extrinsic wafer material is desired, boron (B), gallium (Ga) or indium (In) will be used. Gallium and indium are solid source materials, while boron is injected into the plasma chamber 28 as a gas, typically boron trifluoride ($BF_3$) or diborane ($B_2H_6$), because boron's vapor pressure is too low to result in a usable pressure by simply heating solid boron.

If a p type extrinsic material is to be produced suitable source materials include source gases arsine ($AsH_3$) and phosphine ($H_3P$) and vaporized solid antimony (Sb). Energy is applied to the source materials to generate positively charged ions in the plasma chamber 28. As can be seen in FIG. 1B, the positively charged ions exit the plasma chamber 28 through an elliptical arc slit 29 in a cover plate 30 overlying an open side of the plasma chamber 28.

During a production run, that is, when semiconductor wafer workpieces 21 are being impinged upon by the ion beam 14 and thereby being implanted with ions, the ion beam 14 travels through an evacuated path from the ion source 12 to an implantation chamber 22, which is also evacuated. Evacuation of the beam path is provided by a pressure regulation system comprising a pair of vacuum pumps 31. One application of an ion source 12 constructed in accordance with the present invention is for a "low" energy implanter. The ion beam 14 of this type of implanter tends to diffuse over its beam path and hence the implanter 10 has been designed to have a relatively "short" path from the source 12 to the implantation chamber 22.

Ions in the plasma chamber 28 are extracted through the arc slit 29 of the plasma chamber cover plate 30 and are formed into the ion beam 14 that traverses the distance between the ion source 12 and the implantation station 16 by a beam forming and directing structure 50. The beam forming and directing structure 50 includes a mass analyzing or resolving magnet 32 and a set of electrodes 34. The plasm chamber ions are accelerated by the set of electrodes 34 adjacent the plasma chamber toward the mass analyzing magnet 32 fixed to the support 24. The set of electrodes 34 extract the ions from the plasma chamber interior and accelerate the ions into a region bounded by the mass analyzing magnet 32. An ion beam path through the magnet region is bounded by a beam guide 36. During production runs, an interior region 52 (FIG. 1A) defined by the beam forming and directing structure 50 is evacuated by the pumps 31.

Ions that make up the ion beam 14 move from the ion source 12 into a magnetic field set up by the mass analyzing magnet 32. The strength and orientation of the magnetic field produced by the analyzing magnet 32 is controlled by the control electronics 20 coupled to a magnet connector 40 (FIG. 1A) for adjusting a current through the magnet's field windings.

The mass analyzing magnet 32 causes only those ions having an appropriate mass to charge ratio to reach the ion implantation station 16. The ionization of source materials in the plasma chamber 28 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 32 causes the ions in the ion beam 14 to move in a curved trajectory. The magnetic field that is established by the control electronics 20 is such that only ions having an atomic mass equal to the atomic mass of the desired ion species traverse the curved beam path to the implantation station implantation chamber 22. Located downstream from the analyzing magnet 32 is a resolving plate 60 (FIG. 1A). The resolving plate 60 is comprised of, for example, vitreous graphite and defines an elongated aperture through which the ions in the ion beam 14 pass. At the resolving plate 60, the ion beam dispersion, that is, a width of the ion beam envelope, is at a minimum for production runs.

The resolving plate 60 functions in conjunction with the mass analyzing magnet 32 to eliminate undesirable ion species from the ion beam 14 which have an atomic mass close to, but not identical, to the atomic mass of the desired species of ions. As explained above, the strength and orientation of the mass analyzing magnet's magnetic field is established by the control electronics 20 such that only ions having an atomic weight equal to the atomic weight of the desired species will traverse the predetermined, desired beam path to the implantation station 16. Undesirable species of ions having an atomic mass much larger or much smaller than the desired ion atomic mass are sharply deflected and impact the beam guide 36 or the slit boundary defined by the resolving plate 60.

The beam forming and directing structure 50 also includes a beam neutralizer 74, commonly referred to in the art as an electron shower. The ions extracted from the plasma chamber 28 are positively charged. If the positive charge on the ions is not neutralized prior to implantation of the wafers, the doped wafers will exhibit a net positive charge. Such a net positive charge on a wafer workpiece has undesirable characteristics.

A downstream end of the beam neutralizer 74 is adjacent the implantation chamber 22 where the semiconductor wafer workpieces 21 are implanted with ions. Supported within the implantation chamber is a disk-shaped semiconductor wafer workpiece support 90. Wafer workpieces 21 to be treated are positioned, for example, near an outer edge of the wafer support 90 and the support is rotated at a relatively constant angular velocity by a motor 92. An output shaft of the motor 92 is coupled to a support drive shaft 94 by a belt 96. The ion beam 14 strikes the wafer workpieces as they rotate in a generally circular path. A stepper motor 98 also drives a lead screw 99 to translate the support 90 vertically (shown by arrow labeled "A" in FIG. 1B). This permits multiple rows of semiconductor wafers to be implanted during a production run. Ion dosage received by the workpieces 21 determined by the velocity of translation of the support 90 under the control of the control electronics 20. The implantation station 16 is pivotable with respect to the beam neutralizer housing 75 by a flexible bellows 100 (FIG. 1A).

The ion implanter 10 includes a novel ion beam dosage control assembly 65 (FIG. 1B). The dosage control assembly 65 functions in two modes: a calibration mode and a production run mode. In the calibration mode, calibration circuitry 56 is utilized to obtain a calibration constant value, called the K value, for a specific test gas. Different calibration K values may be calculated by the calibration circuitry 56 for different test gases depending on the composition of the expected residual gas during a production run. During a production run, dosage control circuitry 66 utilizes one or more of the K values to accurately control ion dosage received by the workpieces 21. Essentially, the dosage control circuitry 66 makes use of the calibration constants, that is, the K values to compensate for the effect of the residual gases in the ion beam implanter interior region 52 on the implantation process during a production run.

A test gas selected during the calibration mode is designed to replicate one or more residual gases expected to be present during a production run. While the pumps 31 evacuate the beam forming and directing structure interior region 52 during a production run, residual gases remain. Each residual gas impacts workpiece ion implantation in a different way during a production run. Depending on the volume and characteristics of a residual gas in the interior region 52, its effect on implantation may or may not be significant. If the expected volume and characteristics of a residual gas make it desirable to account for its effects during a production run, a K value corresponding to that gas will have been calculated and stored in a memory 58 during a prior calibration run and that value will be used by the dosage control circuitry 66 to control implantation dosage during the production run.

The dosage control assembly 65 includes a movable restriction plate 70. The restriction plate 70 is attached to an end of a Faraday flag 72 and is movable into and out of the ion beam line by a lever assembly 78. The restriction plate 70, which is preferably made of vitreous graphite, and the Faraday flag 72, which is, for example, metal coated with graphite, are out of the ion beam line. In FIG. 1B, the restriction plate 70 is in the beam line. Those skilled in the art will recognize that other constructions of the restriction plate 70 are possible other than being attached to the Faraday flag 72. Of importance is that the restriction plate 70 is selectively movable into and out of the beam line 14. When moved into the beam line 14 during operation of the implanter 10 in the calibration mode, the ion beam 14 is directed or resolved through an opening or aperture 71 of the restriction plate 70 and, further, when the restriction plate 70 is in the beam line 14, the restriction plate abuts portions of the beam forming and directing structure 50 forming two subregions within the implanter interior region 52 (FIG. 1A).

The dosage control assembly 65 also includes an ion beam current measuring apparatus, for example, a Faraday cage or Faraday cup 110 and a pressure measurement apparatus, for example, an ion gauge 114 (FIG. 1B) disposed in the implantation chamber 22. The dosage control assembly 65 further includes a pair of gas flow pumps 120, 122 (FIG. 1A) which are also part of the pressure regulation system. The dosage control assembly 65 also includes calibration circuitry 56, a memory 58, pressure compensating dosage control circuitry 66, and a motor control system 68, all of which are part of the control circuitry 20.

The Faraday cup 110 is mounted behind the workpiece support 90 and is used to measure ion beam current, $I^f$, which passes through a slot 112 formed in the support 90. The slot 112 is also part of the dosage control assembly 65. The Faraday cage 110 measures only a portion of an effective ion beam current, $I^T$, received by the semiconductor wafer workpieces 21. The ion beam 14 is comprised primarily of positive ions and has an incident ion current that will be designated $I^I$. The ion beam current measured by the Faraday cage 110 will be designated $I^f$. The collisions of the primarily positive ion beam 14 with residual gas atoms remaining along the evacuated beam line in the interior region 52 causes electrons to be added or taken away from some of the positive ions with probabilities which depend on the ion species, the ion velocity and the gas through with the ion passes. The resulting effective ion beam current, $I^T$, at the implantation surface of the workpieces 21 has components with different charges:

$$I^T = I^0 + I^- + I^+ + I^{++} + \ldots$$

where:
$I^0$ = ion beam current component comprising neutral particles $I^-$ = ion beam current component comprising singularly charged negative ions $I^+$ ion beam current component comprising singularly charged positive ions $I^{++}$ = ion beam current component comprising doubly charged positive ions Each of these ion beam components is effective for implantation of the workpieces 21 but not all are measured equally by the Faraday cage 110. The Faraday cage ion beam current, $I^f$, includes all the positive ion beam current components including $I^+$, $I^{++}$, $I^{+++}$, etc. as well as the negative ion beam current component $I^-$. The Faraday cage ion beam current, $I^f$, does not include $I^0$ or $I^-$.

A major source of residual gas within the implanter interior region 52 during a production run is the beam neutralization gas pumped into the beam neutralizer housing 74. Typically, this is xenon or argon gas. The beam neutralization gas is used for charging control of the ion beam 14. Depending on the implantation, other gases suitable for used as beam neutralization gas may be employed. As implanters such as the implanter 10 are utilized at lower beam energies to facilitate production of higher density semiconductor integrated circuit chips, the beam neutralization gas will account for a majority of the residual gas present in the implanter interior region 52 during implantation. Accounting for the either the first or second greatest volume of residual gas in the interior region of such low energy ion implanters as the implanter 10 during a production run may be gas generated from volatilization of photoresist material coated on the semiconductor wafer workpieces. As the ion beam impinges on the workpiece surfaces, the photoresist material is volatized or outgassed.

A much smaller source of residual gas in the ion beam interior region 52 during a production run results from source gas which escapes from the ion source plasma chamber 28. Source gases are injected into the plasma chamber 28 and are ionized. The set of electrodes 34 direct positively charged ions escaping through the plasma chamber cover arc slit 29 along the ion beam beam line. A small amount of the source gas escapes through the arc slit and accounts for a small portion of the residual gas in the ion beam implanter interior region. Typical examples of source gases include arsine, phosphine, vaporized antimony, diborane, boron triflouride, vaporized gallium and vaporized indium.

As will be explained below, the composition of residual gas expected during a production run can be determined based on: a) knowing the neutralization gas used in the ion beam neutralization process; b) knowing whether the workpieces 21 are coated with a photoresist material; and c) knowing what source gas or gases are being used. Calibration may be done using test workpieces instead of actual semiconductor wafer workpieces 21 to avoid the cost associated with improperly implanted workpieces which must be scrapped.

A different K value will be determined for each test gas. The composition of the residual gases expected during a production run is estimated and for each residual gas, a determination must be made as to each residual gas component as to whether or not the expected volume and characteristics of that gas component render it important enough to be accounted for or compensated for during the production run. That is, as to each residual gas component, it must be determined if that gas component will significantly affect implantation dosage of the workpieces 21 and, therefore, make it desirable to include the gas component in the compensation process undertaken by the dosage control circuitry 66.

Once the K value for an expected, significant residual gas component is calculated by the calibration circuitry 56, it is stored in the memory 58 and is utilized by the dosage control circuitry 66 to determine the effective ion beam current, $I^T$. The effective ion beam current, $I^T$, is calculated by the dosage control circuitry 66 based on the measured pressure, P, in the implantation chamber 22 and the Faraday cage ion current, $I^f$ and is used by the dosage control circuitry 66 to accurately control the ion beam dosage received by the plurality of semiconductor wafer workpieces 21. It should be appreciated that a calibration run is not required for each production run provided that the appropriate K values for the anticipated, significant residual gases have previously been stored in the memory 58 by the calibration circuitry 56.

In accordance with an aspect of the present invention, The pressure compensation factors or K values for the anticipated significant residual gasses may be determined by correlating the sheet resistances from bare and photoresist coated implanted wafers. The ion beam is neutralized by interactions with the gas molecules present in the process chamber during wafer implant, and thus pressure compensation of this neutralization is desirable to deliver the proper dose. The parameters necessary for pressure compensation have traditionally been determined by implanting a matrix of four monitor wafers with various recipe parameters. The present invention provides a new method for accurately determining these factors with one or a small number of implants. The new method is faster, less expensive and is more immune to systematic errors in the implanter and post processing. This procedure may be employed to generate tables of pressure compensation factors for ion implanters, and offers improvements to SPC collection at customer sites.

The dosimetry systems of most modern implanters use a Faraday cup (e.g., Faraday cup 110 of FIG. 1B) to estimate the beam flux striking the wafers. During normal operation, the ion implanters are filled with a variety of different gasses at pressures high enough to cause significant neutralization of the beam. The resulting beam neutralization complicates the interpretation of dosimetry measurements made by the Faraday cup. Sources of gas include argon or xenon from the charge neutralization control systems, stray source gasses, water bleed to control beam stability, and outgassing of the photoresist as it is struck by the ion beam. Often the most significant gas results from outgassing of the photoresist as it is struck by the ion beam. As described above, many batch implanters have an active correction for this effect using a pressure compensation technique, where pressure readings from the process chamber are scaled by a compensation factor of beam neutralization to correct the Faraday readings and provide an accurate dosimetry measurement. This allows the implanter to track the ion flux at all times during an implant to achieve better uniformity of the dose on the product wafers.

Accurate determination of the neutralization compensation factor is desired to properly compensate for beam neutralization. This determination has heretofore required the implantation of a matrix of at least four test wafers at non-standard or non-production type operating conditions. However, test wafers are expensive. Moreover, the implantation and measurement of test wafers requires an implantation system to be taken off line, which results in lost production and other costs. The present invention provides for an accurate pressure compensation factor determination using only one or two test wafer implants, and thus provides an improved method and system for determining pressure compensation factors in ion implanters. The invention provides a technique that allows the beam neutralization pressure compensation factors to be estimated with a single monitor wafer during production running. The method of the present invention further provides more accurate measurements of the compensation factors using two monitor implants under standard operating conditions, whereas the prior techniques implanted a series of four test wafers with non-standard, non-production pressure compensation settings (e.g., zero compensation and max compensation).

Referring now to FIGS. 1A, 1B, and 2, as charged ions pass through the beam guide (e.g., beam guide 36 of FIG. 1A) they suffer charge exchange collisions with stray gas molecules as illustrated in FIG. 2. Some fraction of the ions are neutralized and are not counted by the Faraday cup 110. Therefore, the measured ion beam current does not accurately reflect the actual dopant flux at the wafer. In general one charge exchange reaction dominates all the other effects, so the population of charged ions will exponentially decay with increasing gas load. The following equation (1) predicts the actual dopant flux at the disk $I_{dose}$, as a function of the measured electrical current ($I_{disk}$), the measured pressure (P) at one point in the beamline and an un-normalized calibration factor K:

$$I_{dose} = I_{disk} exp(KP) \quad (1)$$

where K is the "K-factor", and P is the pressure recorded on an ion gauge in the process chamber. The parameter K will be referred to as the K-factor. The K-factor may be re-scaled and referred to as a Pcomp (pressure compensation) factor. FIG. 2 is a graphical illustration of a boron ion 150 suffering charge exchange with a neutral xenon gas 152, whereby a negatively charged electron 154 from the xenon gas 152 neutralizes the positively charged boron ion 150 to create a neutral boron ion 150a.

Equation (1) also may be used when the charge exchange reaction adds an electron to the beam ions. For simplicity, the following examples include the neutralization effects of a single gas. However, it will be appreciated that the invention provides for compensation parameter determination in association with implantation in the presence of multiple gasses. For example, equation (1) may be modified to include the effects of multiple gasses.

Figure 3A:
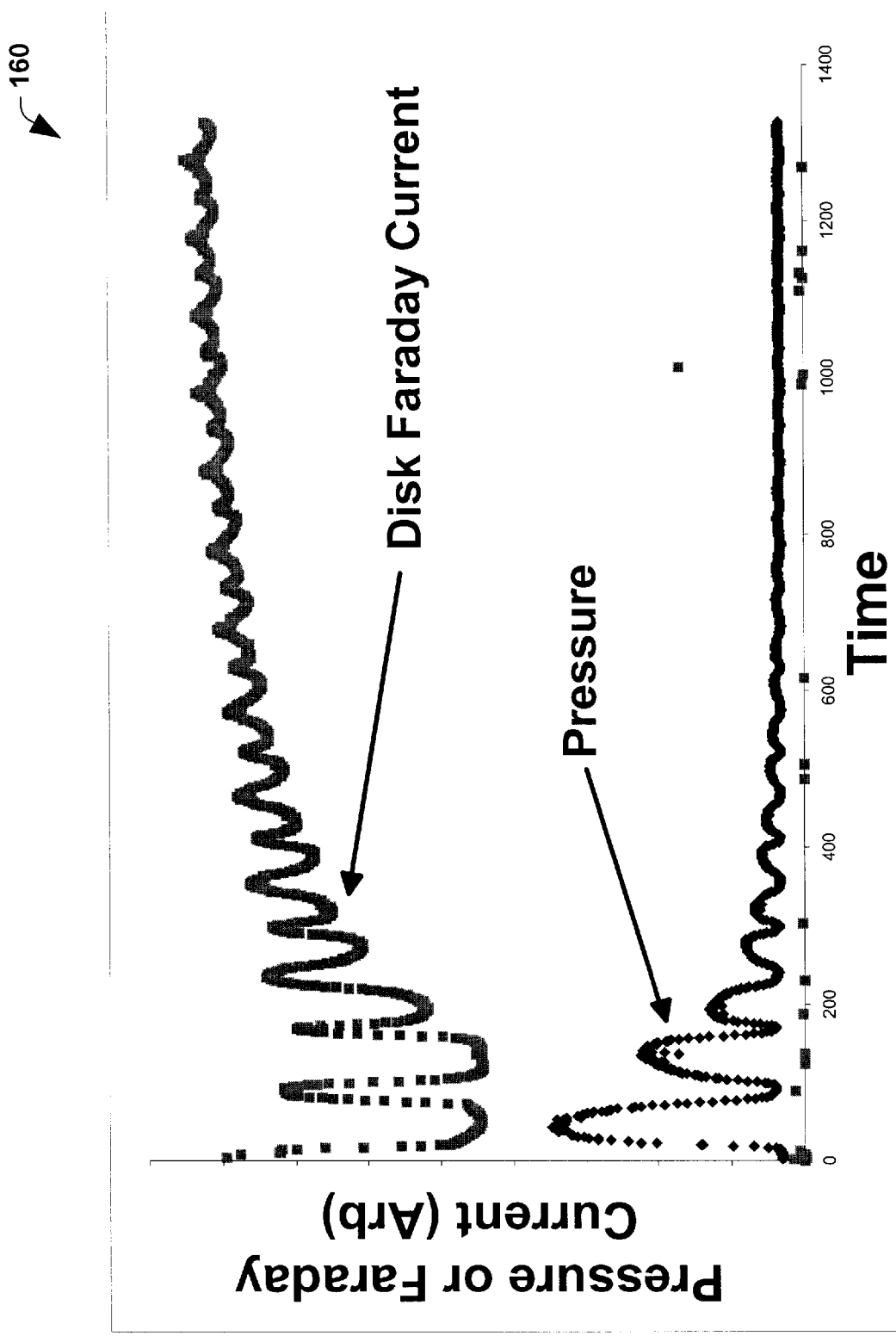
FIG. 3A is a graph illustrating the relationship between implantation pressure and Faraday current over time.
Figure 3B:
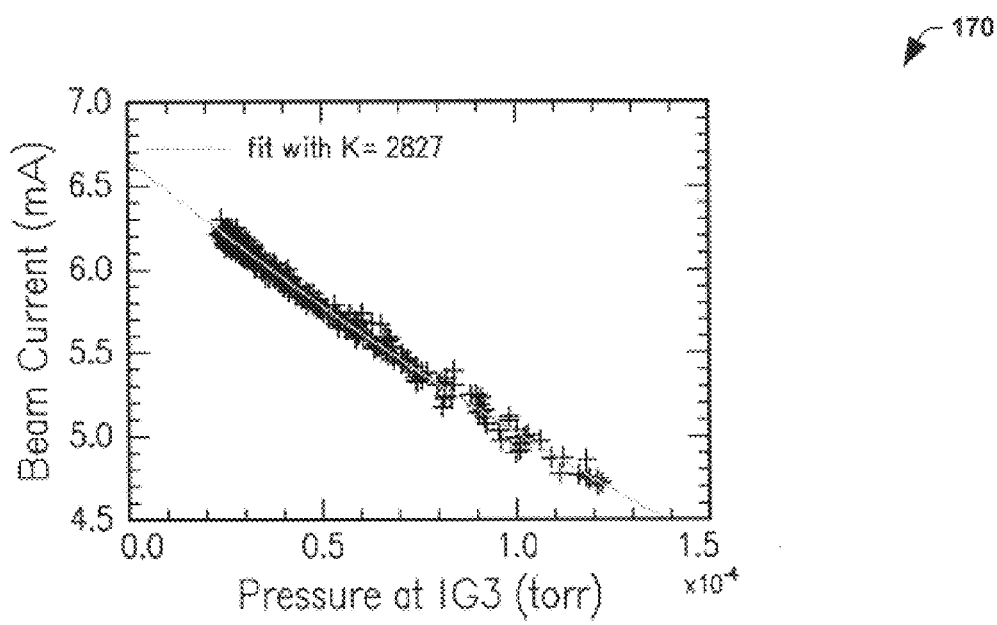
FIG. 3B is an exemplary graph illustrating beam current versus pressure.

As illustrated in FIG. 3A, the pressure and Faraday cup current measurements (e.g., made via Faraday cup 110 of FIG. 1B) vary with time during implantation. FIG. 3A illustrates that pressure in the chamber is related to the beam current measured by the Faraday cup. As illustrated and described in greater detail hereinafter with respect to FIG. 5, the result of the variance in Faraday cup current measurement and the pressure in the process chamber or end station (e.g., end station 16) may result in spatial sheet resistance variations in implanted workpieces absent pressure compensation. Referring also to FIG. 3B, a graph 170 illustrates an example of pressure and current data from a high current implanter end station. The data in graph 170 is fit using equation (1), thus verifying the pressure compensation model. The illustrated data in FIG. 3B is overlaid by an exponential fit according to equation (1). The exemplary data in graph 170 is fit by the function I=6.7 exp(−2827P). Hence the K-factor is 2827 and the Pcomp=32.7% in the illustrated example.

Figure 4:
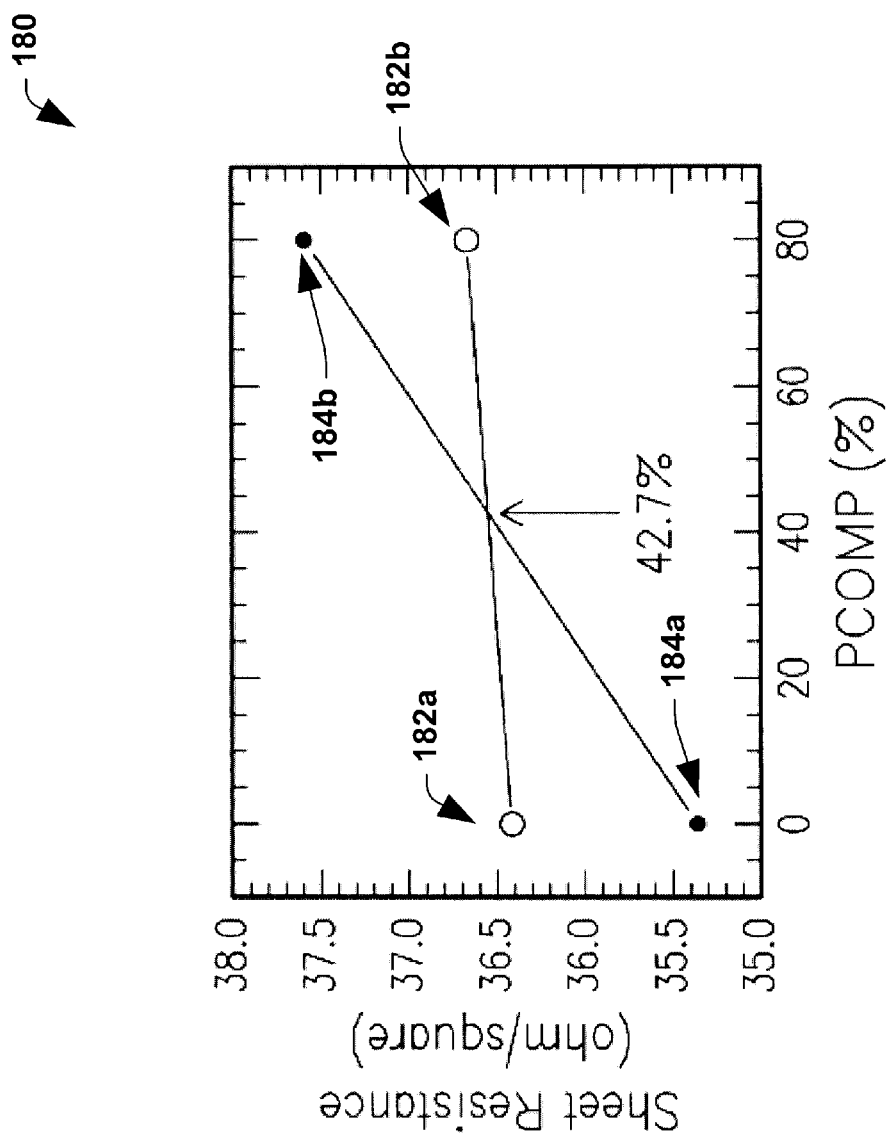
FIG. 4 is an exemplary graph illustrating a crossing of lines method of determining a pressure compensation factor.

Referring now to FIG. 4, the K-factor used in equation (1) to determine the actual dose ($I_{dose}$) has previously been determined using the "crossing of lines method". As illustrated in the graph 180, two monitor implants 182a and 182b are performed (e.g., in the ion beam implanter 10 of FIGS. 1A and 1B) with bare dummy test wafer workpieces (not shown), each using different Pcomp settings (e.g., 0 and 80, respectively). Two monitor implants 184a and 184b are then performed with photoresist (PR) coated dummy wafers and different Pcomp settings. It will be noted in this regard that compensation values of 0 and 80 represent extremes and typically do not reflect actual conditions. Lines are then drawn between each pair of measurements, and the point where they cross is the estimate of the Pcomp setting that gives the same sheet resistance independent of gas load (e.g., 42.7%). From this Pcomp, the K-factor may be determined and used in equation (1) to determine $I_{dose}$. With $I_{dose}$ determined, dosimetry changes may be implemented.

It will be appreciated that the crossing of lines method graphically illustrated in FIG. 4 requires the implantation and measurement of four test wafers, each of which is relatively expensive. In addition, the time to implant four such test wafers may have an associated cost, such as down time for the implantation system. Thus, although the crossing of lines method may yield a determination of the desired pressure compensation factor or factors, it is desirable to reduce the cost in achieving such a determination. In addition, the crossing of lines method does not contemplate or otherwise utilize the pressure readings recorded during the implant (e.g., by dosage control circuitry 66 in control electronics 20 via the ion or pressure gauge 114). It has been appreciated by the inventor of the present invention that these pressure readings may be advantageously employed to determine the Pcomp factor (and the K-factor) with fewer implants, in accordance with the present invention.

Figure 5:
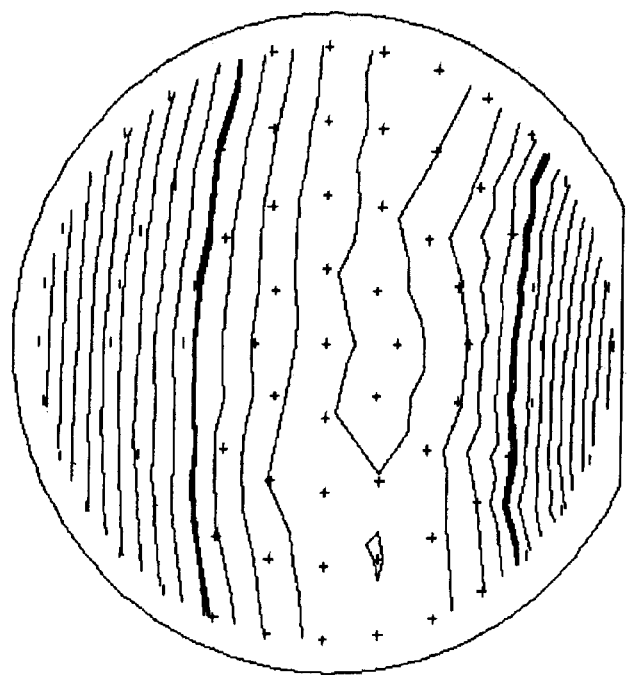
FIG. 5 is a top plan view of an exemplary wafer sheet resistance map from an implant not employing pressure compensation.
Figure 6:
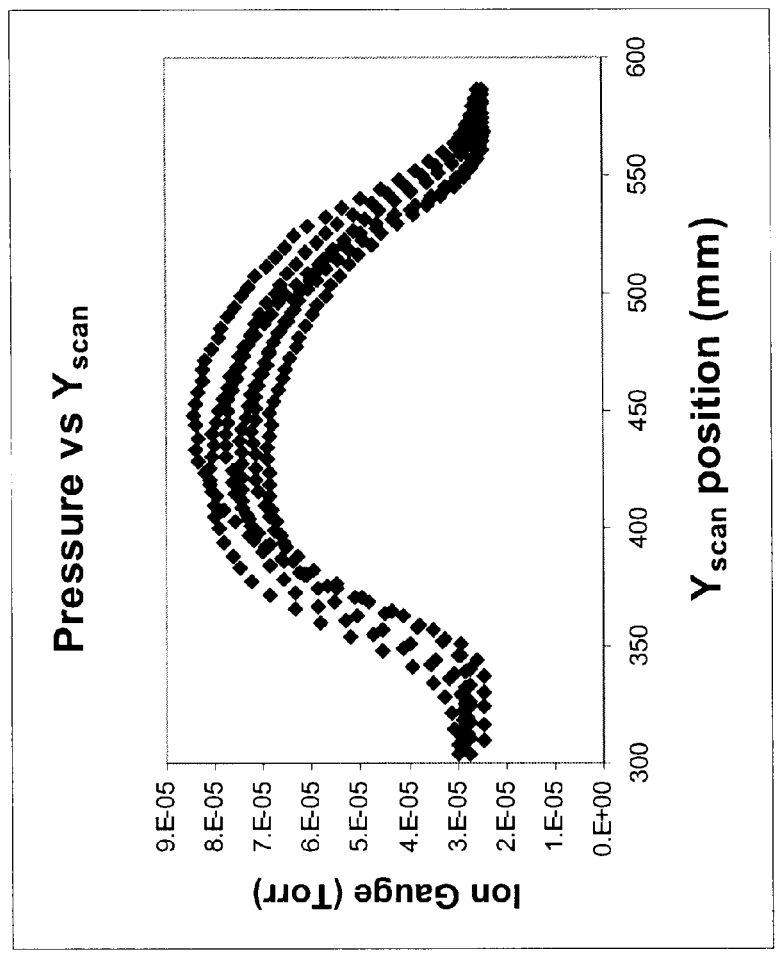
FIG. 6 is an exemplary graph illustrating pressure versus scan position.

FIG. 5 shows a typical 81 point sheet resistance (Rs) map 190 of an annealed wafer implanted without the use of pressure compensation. As can be seen in FIG. 5, without any compensation, the sheet resistance spatial uniformity is poor. The method of the present invention may be advantageously employed in order to predict changes to the resistance map of the wafer that would occur if the pressure compensation system were added, or if the compensation factor were changed. In accordance with an aspect of the present invention, this may be accomplished by employing recorded pressure readings from the implanter shown in the graph 192 of FIG. 6 in combination with the model described in equation (1). The graph 192 illustrates exemplary pressure readings for a typical photoresist (PR) implant, wherein the center of the wafer is at 450 mm.

In accordance with an aspect of the present invention, a map of the wafer is divided into vertical bands. For each band a corrected sheet resistance Rs is predicted using the following equation:

$$R_S(\text{predicted}) = R_S(\text{measured}) \left[ \frac{\Sigma I_{implanted} \exp(-K_{used}P)\exp(K_{predicted}P)}{\Sigma I_{implanted}} \right]^\zeta \quad (2)$$

where

P is the pressure in the implanter at each recorded time,

Kused is the K-factor used for implanting,

Kpredicted is the K-factor that we would like to try,

Iimplanted is the corrected Faraday cup current, $\zeta$ is a dose sensitivity factor related to the non-linearity of the sheet resistance with dose, Rs(predicted) is a desired sheet resistance for implanted wafers, and Rs(measured) is the measured sheet resistance of the test wafer.

Thus, an initial K-factor may be assumed (e.g., Kused), and used in implanting one or more test wafers. The ion beam current and process chamber pressure are then measured during the implantation of the test wafer, after which the sheet resistance of the test wafer or wafers is measured. The K-factor to be subsequently used (e.g., Kpredicted) may be determined by correlating the assumed K-factor with the measured values as well as a desired sheet resistance. For example, the Kpredicted value may be obtained by solving equation (2) for Kpredicted, using the measured pressure (P), current (Iimplanted), and sheet resistance (Rs (measured)) values, together with the initially assumed K-factor (Kused) and a desired sheet resistance (Rs (predicted)). Alternatively, various trial K-factors (Ktrial) may be substituted into equation (2) (e.g., for Kpredicted) until the desired sheet resistance (Rs(predicted)) is obtained.

The equation (2) may represent four basic steps. The sheet resistance (Rs) of each band is first corrected to remove the pressure correction K-factor (Kused) that was applied during the implant. Then the effect of the initial trial K-factor (Ktrial) is applied. The pressure readings (P) are weighted by the beam current present for each reading (Iimplanted). Finally the correction is scaled by the dose sensitivity factor, $\zeta$, which is used to compensate for the non-linear response of sheet resistance with applied dose.

The best K-factor to use for optimal pressure compensation may be determined by using equation (2) to evaluate predicted Rs maps. Thus, Ktrial may be varied until a map is identified which meets a target criteria (e.g., a desired sheet resistance Rs(predicted)). For example, one target criteria may simply be that the predicted Rs map be as uniform as possible. When using this criteria, only a single monitor or test wafer needs to be implanted and processed, thus significantly reducing the cost and time associated with the crossing of lines and other prior techniques.

Figure 7B:
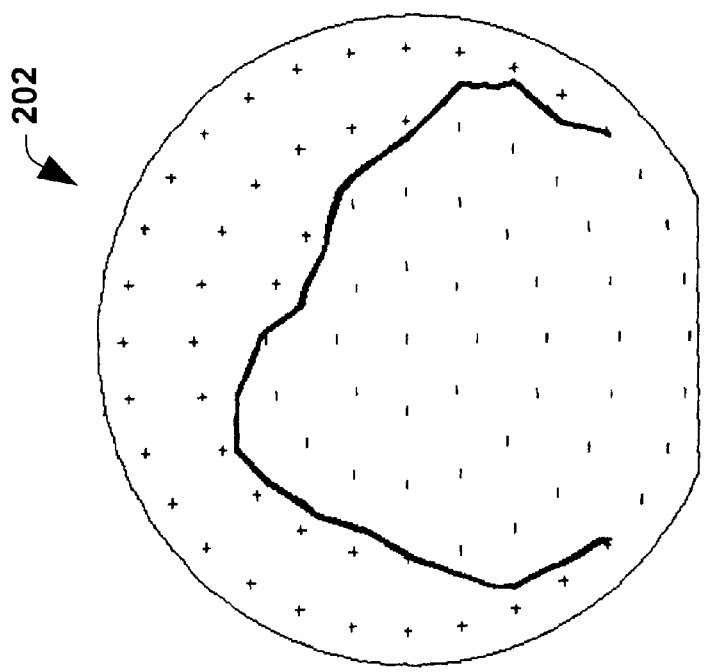
FIG. 7B is a top plan view of an exemplary wafer sheet resistance map after system calibration.
Figure 7A:
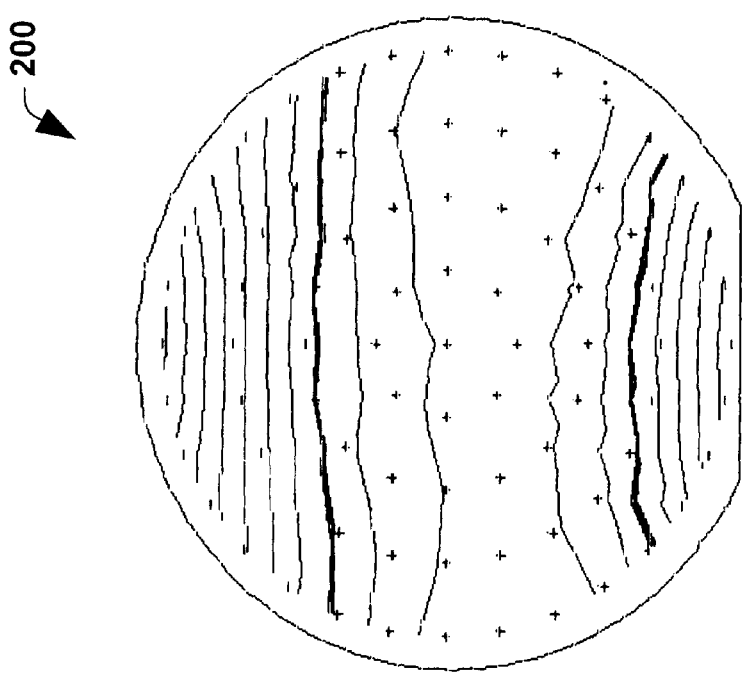
FIG. 7A is a top plan view of an exemplary wafer sheet resistance map before system calibration.

FIGS. 7A and 7B illustrate the use of this technique. A wafer 200 in FIG. 7A was implanted (e.g., in the ion implantation system 10 of FIGS. 1A and 1B) using a large error in the pressure compensation factor with 30 KeV boron and 12 photoresist coated dummies. Equation (2) was used to predict the value of Ktrial predicted to give the most uniform sheet resistance. FIG. 7B shows the sheet resistance map with this prediction. Thus, the use of one test wafer 200 yields significant improvement in the sheet resistance uniformity in the subsequently implanted wafer 202. The invention thus provides significant advantages over previous techniques, wherein four test wafers were required to determine one or more pressure compensation factors. It will be appreciated that the method of the present invention may be iterated one or more times, in order to further improve the resultant pressure compensation factor.

While the results in FIG. 7B are a significant improvement over prior pressure compensation factor determination techniques, the single implant method may be supplemented to account for non-uniformities in the sheet resistance wafer maps that are not caused by pressure compensation, for example, due to annealing, charging, or channeling. In accordance with another aspect of the invention, the method may be further improved via the correlation of bare test wafer implants with implants of a photoresist coated wafer, as illustrated and described in greater detail hereinafter.

As pointed out above, the goal of pressure compensation is to ensure that the same dose is implanted independent of gas load. A more robust test that may be employed to determine the best K-factor is to implant two monitor or test wafers, one with photoresist and one which is bare. Equation (2) may then be used to calculate a new K-factor that will best match the sheet resistance of the two monitor wafers.

Referring now to FIG. 8, tables 210a and 210b illustrate exemplary results (e.g., measured sheet resistances Rs of the bare implant and the photoresist coated implant) using this method, where the starting K-factors (e.g., Kused) were intentionally quite far off from their expected values (210a). In general the method centers on the best K-factor quite readily. These implants were used to establish tables of calibration factors as a function of beam species and energy that are installed on high current and/or other types of ion implanters.

The implant results after a first calibration run (210b) illustrate a general reduction in the dose shift between a bare wafer and a wafer having a photoresist coating, in accordance with the invention, where the dose shift is an indication of the uniformity in sheet resistance between the bare and photoresist test wafers. Thus, a large dose shift indicates a lack of uniformity and a small dose shift indicates good or improved uniformity. As can be seen from the results in FIG. 8, the dose shift is generally reduced, thus indicating the same or similar dose applied to each test wafer independent of gas loading. It will be appreciated that additional iterations may be performed, whereby further refinement of the K-factor determination may be accomplished, in order to improve the uniformity of the implanted wafer sheet resistance.

Figure 9:
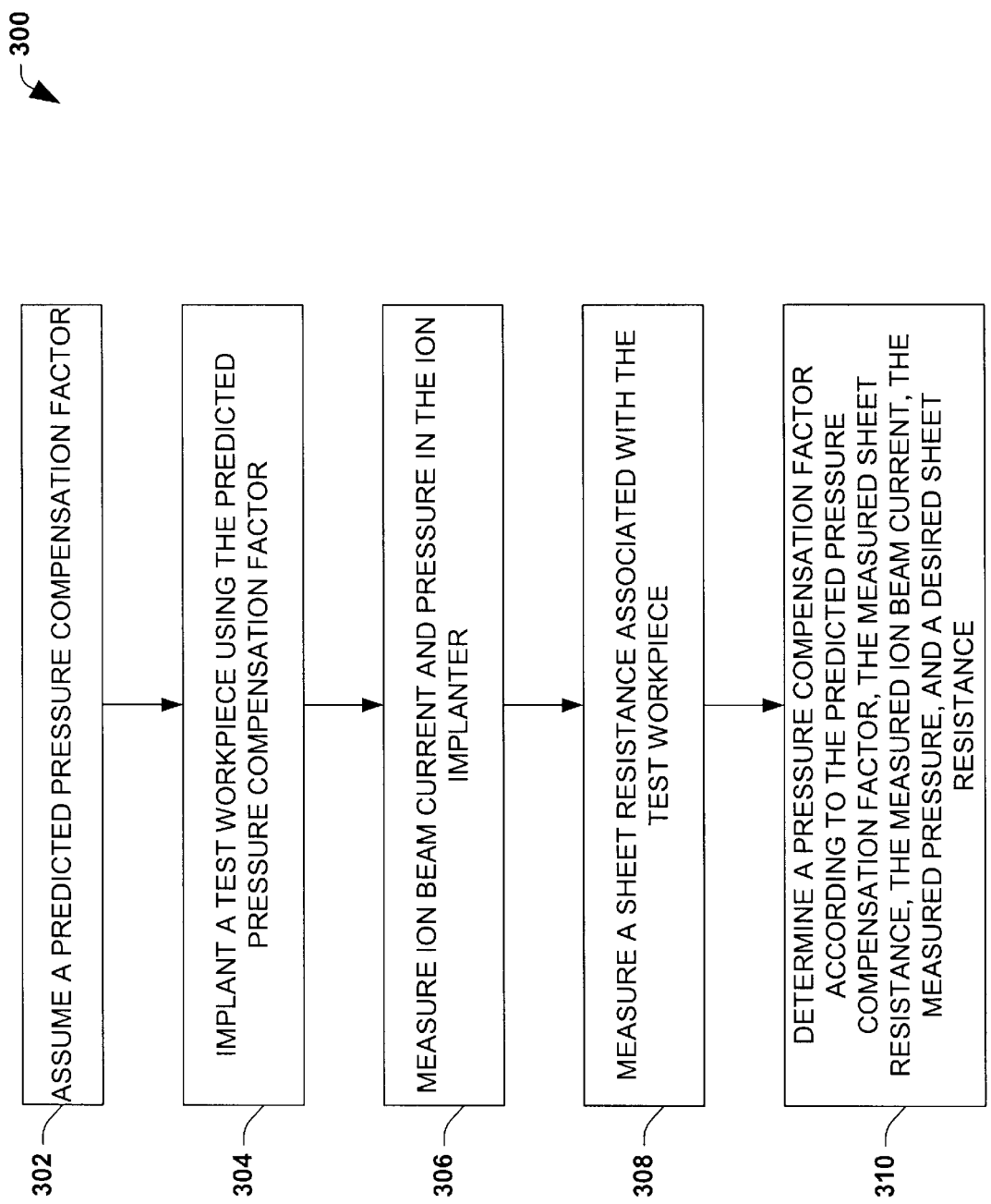
FIG. 9 is a flow diagram illustrating an exemplary method in accordance with the invention.

Referring now to FIG. 9, an exemplary method 300 is illustrated for determining pressure compensation factors for use in an ion implantation system. Method 300 begins at step 302, wherein an initial predicted pressure compensation factor is assumed (e.g., Kused in equation (2)). It will be appreciated that initial Kused values typically may be selected based on historical experience of typical K-factors for the particular implant species and energy being employed. Thereafter at step 304, a test workpiece is implanted in an ion implantation system (e.g., system 10 of FIGS. 1A and 1B) using the predicted pressure compensation factor. During the implantation, the ion beam current and the pressure in the implantation chamber are measured at step 306 (e.g., via the Faraday cup 110 and ion pressure gauge 114 of FIG. 1B).

After the test workpiece has been implanted, a sheet resistance associated with the workpiece is measured at step 308. At step 310, a pressure compensation factor (e.g., Kpredicted of equation (2)) is determined according to the previously assumed pressure compensation factor used in the implant (e.g., Kused), the measured test workpiece sheet resistance Rs, the ion beam current (e.g., measured via Faraday cup 110), and the pressure (e.g., measured using gauge 114), as well as a desired sheet resistance value (e.g., Rs(predicted)). For example, the pressure compensation factor may be determined according to equation (2) as illustrated and described above.

In accordance with another aspect of the invention, the measured sheet resistances of two test workpieces may be taken into account in determining the pressure compensation factor. Referring now to FIG. 10, another exemplary method 400 of determining a pressure compensation factor is illustrated. Beginning at step 402, an initial predicted pressure compensation factor is assumed. Thereafter at step 404, first and second test workpieces are implanted in an ion implantation system (e.g., FIGS. 1A and 1B) using the predicted pressure compensation factor. One of the first and second workpieces may be bare, while the other workpiece comprises a photoresist coating.

During the implantation, the ion beam current and the pressure in the implantation chamber are measured at step 406. After the first and second test workpieces have been implanted, first and second sheet resistances respectively associated with the first and second test workpieces are measured at step 408. At step 410, a pressure compensation factor is determined according to the predicted pressure compensation factor, the measured first and second test workpiece sheet resistances, ion beam current, and pressure, and a desired sheet resistance value. For example, the pressure compensation factor may be determined according to equation (2) as illustrated and described above.

The inventive method may thus be used to measure K-factors for use on various ion implanters. The method gives accurate results with fewer implants than the previous "crossing of lines" method and other prior techniques, making it the method of choice for generating the factory calibration tables for such implanters. The method may further be employed in the field in association with the collection and processing of large data samples from several of the tools found in a fabrication facility. The invention further comprises software products which implement the above described methods.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A method of determining a pressure compensation factor for use in an ion implantation system, comprising:
   providing a test workpiece in the ion implantation system, the test workpiece having a band region;
   providing an initial predicted pressure compensation factor;
   implanting the band region with an ion beam using the ion implantation system and the initial predicted pressure compensation factor while measuring ion beam current and a pressure in the ion implantation system;
   measuring a sheet resistance associated with the implanted test workpiece; and
   determining a pressure compensation factor according to the initial predicted pressure compensation factor, the measured sheet resistance, the measured ion beam current, the measured pressure, and a desired sheet resistance.

2. The method of claim 1, wherein providing an initial predicted pressure compensation factor comprises estimating the compensation factor based upon an implant species used for implanting the test workpiece.

3. The method of claim 1, wherein implanting the band region using the ion implantation system and the initial predicted pressure compensation factor comprises:
   calculating a predicted actual dopant flux at the test workpiece using the initial predicted pressure compensation factor, the measured ion beam current and the pressure; and
   varying an ion dose at the test workpiece based on the predicted actual dopant flux.

4. The method of claim 3, wherein varying the ion dose comprises varying a slow scan rate of the ion implantation system, thereby varying a rate at which the test workpiece scans across the ion beam.

5. The method of claim 3, wherein calculating the predicted actual dopant flux at the test workpiece comprises utilizing the following equation:

$$I_{dose} = I_{disk} \exp(KP),$$

wherein $I_{dose}$ comprises the predicted actual dopant flux, $I_{disk}$ comprises the measured ion beam current, P comprises the measured pressure, and K comprises the initial predicted pressure compensation factor.

6. The method of claim 1, wherein determining the pressure compensation factor comprises:
   (a) inputting a trial pressure compensation factor, the initial predicted pressure compensation factor, the measured sheet resistance, the measured ion beam current and the measured pressure into a dosimetry algorithm and generating a sheet resistance resulting therefrom;
   (b) comparing the generated sheet resistance to the desired sheet resistance;
   (c) modifying the trial pressure compensation factor based on the comparison if the generated sheet resistance differs from the desired sheet resistance more than a predetermined amount;
   (d) repeating steps (a)–(c) until the generated sheet resistance is within a predetermined amount of the desired sheet resistance; and
   (e) using the modified trial pressure compensation factor of step (d) as the pressure compensation factor for use in the ion implantation system.

7. The method of claim 6, wherein the dosimetry algorithm comprises:

$$R_S(\text{predicted}) = R_S(\text{measured}) \left[ \frac{\Sigma I_{implanted} \exp(-K_{used} P) \exp(K_{predicted} P)}{\Sigma I_{implanted}} \right]^{\zeta},$$

wherein P comprises the measured pressure in the ion implantation system, $K_{used}$ comprises the initial trial pressure compensation factor, $K_{predicted}$ is the modified trial pressure compensation factor, $I_{implanted}$ is the measured beam current, $\zeta$ is a dose sensitivity factor related to a non-linearity of the sheet resistance with dose, $R_{s(measured)}$ comprises the measured sheet resistance of the test workpiece, and $R_{s(predicted)}$ comprises the desired sheet resistance.

8. The method of claim 1, wherein determining the pressure compensation factor comprises:
   inputting a trial pressure compensation factor into a dosimetry algorithm; and
   solving the dosimetry algorithm for the pressure compensation factor for a desired sheet resistance.

9. The method of claim 8, wherein the dosimetry algorithm comprises:

$$R_S(\text{predicted}) = R_S(\text{measured}) \left[ \frac{\Sigma I_{implanted} \exp(-K_{used} P) \exp(K_{predicted} P)}{\Sigma I_{implanted}} \right]^{\zeta},$$

wherein P comprises the measured pressure in the ion implantation system, $K_{used}$ comprises the initial trial pressure compensation factor, $K_{predicted}$ is the modified trial pressure compensation factor, $I_{implanted}$ is the measured beam current, $\zeta$ is a dose sensitivity factor related to a non-linearity of the sheet resistance with dose, $R_{s(measured)}$ comprises the measured sheet resistance of the test workpiece, and $R_{s(predicted)}$ comprises the desired sheet resistance.

10. The method of claim 1, further comprising the steps of:
    implanting multiple band regions of the test workpiece with an ion beam using the ion implantation system and the initial predicted pressure compensation factor while measuring ion beam current and a pressure in the ion implantation system; measuring a sheet resistance associated with the implanted test workpiece for each of the band regions; and
    determining a pressure compensation factor collectively for all the band regions based upon a predetermined target criteria using the initial predicted pressure compensation factor, the measured sheet resistance, the measured ion beam current, the measured pressure, and a desired sheet resistance.

11. The method of claim 10, wherein the predetermined target criteria comprises a maximization of sheet resistance uniformity across the band regions.

12. A method of determining a pressure compensation factor for use in an ion implantation system, comprising:
   providing first and second test workpieces in the ion implantation system, the first and second test workpieces each having a band region, wherein one of the first and second test workpieces includes a photoresist film over the test workpiece, and the other of the first and second test workpieces does not include a photoresist film;
   providing an initial predicted pressure compensation factor;
   implanting the band regions of the first and second test workpieces with an ion beam using the ion implantation system and the initial predicted pressure compensation factor while measuring ion beam current and a pressure in the ion implantation system;
   measuring first and second sheet resistances associated with the implanted first and second test workpieces, respectively; and
   determining a pressure compensation factor according to the initial predicted pressure compensation factor, the first and second measured sheet resistances, the measured ion beam current, the measured pressure, and a desired sheet resistance.

13. The method of claim 12, wherein the other of the first and second test workpieces not including a photoresist film comprises a bare test workpiece.

14. The method of claim 12, wherein providing an initial predicted pressure compensation factor comprises estimating the compensation factor based upon an implant species used for implanting the test workpieces.

15. The method of claim 12, wherein implanting the band regions of the first and second test workpieces using the ion implantation system and the initial predicted pressure compensation factor comprises:
   calculating a predicted actual dopant flux at the test workpieces using the initial predicted pressure compensation factor, the measured ion beam current and the pressure; and
   varying an ion dose at the test workpieces based on the calculated predicted actual dopant flux.

16. The method of claim 15, wherein varying the ion dose comprises varying a slow scan rate of the ion implantation system, thereby varying a rate at which the test workpieces scan across the ion beam.

17. The method of claim 15, wherein calculating the predicted actual dopant flux at the test workpieces comprises utilizing the following equation:

$$I_{dose} = I_{disk} \exp(KP),$$

wherein $I_{dose}$ comprises the predicted actual dopant flux, $I_{disk}$ comprises the measured ion beam current, P comprises the measured pressure, and K comprises the initial predicted pressure compensation factor.

18. The method of claim 12, wherein determining the pressure compensation factor comprises:
   (a) inputting a trial pressure compensation factor, the initial predicted pressure compensation factor, the measured sheet resistance, the measured ion beam current, and the measured pressure into a dosimetry algorithm and generating a sheet resistance resulting therefrom for both the first and second test workpieces;
   (b) determining a dose shift between the first and second test workpieces, wherein the dose shift indicates an amount of dose uniformity therebetween;
   (c) modifying the trial pressure compensation factor based on the determined dose shift if the dose shift exceeds a predetermined amount;
   (d) repeating steps (a)–(c) until the determined dose shift is within the predetermined amount; and
   (e) using the modified trial pressure compensation factor of step (d) as the pressure compensation factor for use in the ion implantation system.

19. The method of claim 18, wherein the dosimetry algorithm comprises:

$$R_S(\text{predicted}) = R_S(\text{measured}) \left[ \frac{\Sigma I_{implanted} \exp(-K_{used} P) \exp(K_{predicted} P)}{\Sigma I_{implanted}} \right]^{\zeta},$$

wherein P comprises the measured pressure in the ion implantation system, $K_{used}$ comprises the initial trial pressure compensation factor, $K_{predicted}$ is the modified trial pressure compensation factor, $I_{implanted}$ is the measured beam current, $\zeta$ is a dose sensitivity factor related to a non-linearity of the sheet resistance with dose, $R_{s(measured)}$ comprises the measured sheet resistance of the test workpiece, and $R_{s(predicted)}$ comprises the desired sheet resistance.

20. The method of claim 12, wherein determining the pressure compensation factor comprises:
   inputting a trial pressure compensation factor into a dosimetry algorithm; and
   solving the dosimetry algorithm for the pressure compensation factor for a desired sheet resistance.

21. The method of claim 20, wherein the dosimetry algorithm comprises:

$$R_S(\text{predicted}) = R_S(\text{measured}) \left[ \frac{\Sigma I_{implanted} \exp(-K_{used} P) \exp(K_{predicted} P)}{\Sigma I_{implanted}} \right]^{\zeta},$$

wherein P comprises the measured pressure in the ion implantation system, $K_{used}$ comprises the initial trial pressure compensation factor, $K_{predicted}$ is the modified trial pressure compensation factor, $I_{implanted}$ is the measured beam current, $\zeta$ is a dose sensitivity factor related to a non-linearity of the sheet resistance with dose, $R_{s(measured)}$ comprises the measured sheet resistance of the test workpiece, and $R_{s(predicted)}$ comprises the desired sheet resistance.

22. The method of claim 12, further comprising the steps of:
   implanting multiple band regions of the test workpieces with an ion beam using the ion implantation system and the initial predicted pressure compensation factor while measuring ion beam current and a pressure in the ion implantation system;
   measuring a sheet resistance associated with the implanted test workpieces for each of the band regions; and
   determining a pressure compensation factor collectively for all the band regions based upon a predetermined target criteria using the initial predicted pressure compensation factor, the measured sheet resistance, the measured ion beam current, the measured pressure, and a desired sheet resistance.

23. The method of claim 22, wherein the predetermined target criteria comprises a maximization of sheet resistance uniformity across the band regions.

24. A system for determining a pressure compensation factor for use in an ion implantation system, comprising:

a test workpiece having at least one band region;

an ion implantation subsystem operable to implant a workpiece with an ion beam using a pressure compensation factor;

an ion beam current detector operable to measure an ion beam current associated with the workpiece;

a pressure detector operable to measure a pressure associated with the workpiece during implantation thereof;

a motor control system operable to control a scan rate of the workpiece across the ion beam based on the pressure compensation factor; and, a calibration circuitry adapted to determine a pressure compensation factor as a function of the measured pressure and the measured ion beam current, respectively, using fewer than four implants.

25. The system of claim 24, further comprising a resistance measurement system operable to measure one or more sheet resistance characteristics associated with a workpiece, wherein the pressure compensation factor is a function of the one or more sheet resistance characteristics.

26. The system of claim 25, wherein the pressure compensation factor is also a function of a desired sheet resistance characteristic.

27. A system for determining a pressure compensation factor for use in an ion implantation system, comprising:

a test workpiece having a band region;

means for implanting the band region with an ion beam using the ion implantation system and an initial predicted pressure compensation factor;

means for measuring ion beam current and a pressure in the ion implantation system;

means for measuring a sheet resistance associated with the implanted test workpiece; and means for determining a pressure compensation factor according to the initial predicted pressure compensation factor, the measured sheet resistance, the measured ion beam current, the measured pressure, and a desired sheet resistance.

28. A system for determining a pressure compensation factor for use in an ion implantation system, comprising:

first and second test workpieces each having a band region, wherein one of the first and second test workpieces includes a photoresist, and the other of the first and second test workpieces is bare;

means for implanting the band region of the first and second test workpieces with an ion beam using the ion implantation system and an initial predicted pressure compensation factor;

means for measuring ion beam current and a pressure in the ion implantation system;

means for measuring first and second sheet resistances associated with the implanted first and second test workpieces, respectively; and means for determining a pressure compensation factor according to the initial predicted pressure compensation factor, the first and second measured sheet resistances, the measured ion beam current, the measured pressure, and a desired sheet resistance.

* * * * *